(12) United States Patent
Yokomichi et al.

(10) Patent No.: US 7,015,449 B2
(45) Date of Patent: Mar. 21, 2006

(54) LINEAR IMAGE SENSOR

(75) Inventors: Masahiro Yokomichi, Chiba (JP); Satoshi Machida, Chiba (JP); Yukito Kawahara, Chiba (JP)

(73) Assignee: Seiko Instruments Inc., Chiba (JP)

( * ) Notice: Subject to any disclaimer, the term of this patent is extended or adjusted under 35 U.S.C. 154(b) by 257 days.

(21) Appl. No.: 10/367,131

(22) Filed: Feb. 14, 2003

(65) Prior Publication Data
US 2003/0155483 A1 Aug. 21, 2003

(30) Foreign Application Priority Data
Feb. 21, 2002 (JP) .............................. 2002-045036

(51) Int. Cl.
*H01L 27/00* (2006.01)

(52) U.S. Cl. .................................... 250/208.1; 348/308
(58) Field of Classification Search ............ 250/208.1, 250/214 A; 348/302, 308

See application file for complete search history.

(56) References Cited

U.S. PATENT DOCUMENTS 5,262,871 A * 11/1993 Wilder et al. ............... 348/307
6,759,641 B1 * 7/2004 Loose ....................... 250/208.1

FOREIGN PATENT DOCUMENTS

JP 2000-134410 * 5/2000

* cited by examiner

*Primary Examiner*—Thanh X. Luu
(74) *Attorney, Agent, or Firm*—Adams & Wilks

(57) ABSTRACT

A linear image sensor comprises linear image sensor ICs each having light receiving elements arranged according to a preselected resolution level for outputting output signals in accordance with an amount of light received. Switch elements interconnect output terminals of adjacent two or more of the light receiving elements for switching between the preselected resolution level of the light receiving elements to at least one other resolution level constituting a fraction of the preselected resolution level. First amplifier circuits are is connected to output terminals of the light receiving elements. Sample and hold circuits temporarily hold outputs of the first amplifier circuits. Second amplifier circuits are connected to output terminals of the sample and hold circuits. Reading switch elements read outputs of the second amplifier circuits. Scanning circuits control the reading switch elements.

16 Claims, 13 Drawing Sheets

FIG. 12

| RESOLUTION / TERMINAL ELEMENT NAME | a*1/8 [dpm] [dpi] | a*1/6 [dpm] [dpi] | a*1/4 [dpm] [dpi] | a*1/2 [dpm] [dpi] | a [dpm] [dpi] |
|---|---|---|---|---|---|
| X1 | L | H | L | H | L |
| X2 | L | H | H | L | L |
| X3 | H | L | L | L | L |
| 3-n-1 | ON | ON | ON | ON | OFF |
| 3-n-2 | ON | ON | ON | OFF | OFF |
| 3-n-3 | ON | ON | ON | ON | OFF |
| 3-n-4 | ON | ON | OFF | OFF | OFF |
| 3-n-5 | ON | ON | ON | ON | OFF |
| 3-n-6 | ON | OFF | ON | OFF | OFF |
| 3-n-7 | ON | ON | ON | ON | OFF |
| 3-n-8 | OFF | ON | OFF | OFF | OFF |
| 3-n-9 | ON | ON | ON | ON | OFF |
| 3-n-10 | ON | ON | ON | OFF | OFF |
| 3-n-11 | ON | ON | ON | ON | OFF |
| 3-n-12 | ON | OFF | OFF | OFF | OFF |
| 3-n-13 | ON | ON | ON | ON | OFF |
| 3-n-14 | ON | ON | ON | OFF | OFF |
| 3-n-15 | ON | ON | ON | ON | OFF |
| 3-n-16 | OFF | ON | OFF | OFF | OFF |
| 3-n-17 | ON | ON | ON | ON | OFF |
| 3-n-18 | ON | OFF | ON | OFF | OFF |
| 3-n-19 | ON | ON | ON | ON | OFF |
| 3-n-20 | ON | ON | OFF | OFF | OFF |
| 3-n-21 | ON | ON | ON | ON | OFF |
| 3-n-22 | ON | ON | ON | OFF | OFF |
| 3-n-23 | ON | ON | ON | ON | OFF |
| 3-n-24 | OFF | OFF | OFF | OFF | OFF |

FIG. 13

| TEST MODE / TERMINAL ELEMENT NAME | TEST 1 | TEST 2 | TEST 3 |
|---|---|---|---|
| X1 | H | L | H |
| X2 | L | H | H |
| X3 | H | H | H |
| 3-n-1 | OFF | ON | OFF |
| 3-n-2 | ON | OFF | OFF |
| 3-n-3 | OFF | ON | OFF |
| 3-n-4 | ON | OFF | OFF |
| 3-n-5 | OFF | ON | OFF |
| 3-n-6 | ON | OFF | OFF |
| 3-n-7 | OFF | ON | OFF |
| 3-n-8 | ON | OFF | OFF |
| 3-n-9 | OFF | ON | OFF |
| 3-n-10 | ON | OFF | OFF |
| 3-n-11 | OFF | ON | OFF |
| 3-n-12 | ON | OFF | OFF |
| 3-n-13 | OFF | ON | OFF |
| 3-n-14 | ON | OFF | OFF |
| 3-n-15 | OFF | ON | OFF |
| 3-n-16 | ON | OFF | OFF |
| 3-n-17 | OFF | ON | OFF |
| 3-n-18 | ON | OFF | OFF |
| 3-n-19 | OFF | ON | OFF |
| 3-n-20 | ON | OFF | OFF |
| 3-n-21 | OFF | ON | OFF |
| 3-n-22 | ON | OFF | OFF |
| 3-n-23 | OFF | ON | OFF |
| 3-n-24 | ON | OFF | OFF |
| ΦRST1 | NORMAL | NORMAL | NORMAL |
| ΦRST2 | ALWAYS H | ALWAYS H | ALWAYS H |

LINEAR IMAGE SENSOR

BACKGROUND OF THE INVENTION

1. Field of the Invention

The present invention relates to a linear image sensor IC made up of a plurality of light receiving elements that output an output signal in response to a quantity of received light, a plurality of switch elements which are connected between output terminals of adjacent light receiving elements, a sample/hold circuit that holds an output of the light receiving elements, and a scanning circuit that reads electric charges held by the sample/hold circuit under control, and more particularly to a contact type image sensor, an image scanner, a facsimile machine or a copying machine which can change the resolution.

2. Description of the Related Art

For example, JP 5-227362 A has proposed a contact type image sensor in which a control terminal is additionally disposed for resolution control so that a user can change over the resolution in accordance with the applied conditions.

FIG. 11 is a circuit diagram showing a contact type image sensor integrated circuit that has been proposed in the above-mentioned publication. In this conventional art, a control terminal 125 is disposed in an image sensor chip, and the user inputs a signal of a high level or a low level to the control terminal, to thereby realize a changeover of the resolution between a high resolution mode and a low resolution mode. The outline of FIG. 11 will be described now. A start pulse SI and a clock pulse CLK are inputted to a shift register group 104. When a shift register 104a starts due to the start pulse SI, an output of the shift register 104a is supplied to a channel select switch 103a through a NOR gate 121a and an AND gate 120a to turn on the channel select switch 103a, and the cannel select switch 103a picks up a signal from a photo cell 101a to a signal line 107a. Other shift registers 104b to 104f also sequentially start and output signals from the respective photo cells 101b to 101l to the signal lines 107a and 107b. In this example, when a control signal H is inputted to the control signal input terminal 125, analog switches 110a, 110b, 122a and 122b change over so that an image signal with a read density of 16 dots/mm can be obtained at an image output terminal 111. Also, when a control signal L is inputted to the control signal input terminal 125, the analog switch 110a is constantly in an ON state, to thereby obtain an image signal with the read density of 8 dots/mm at an image output terminal 111 which is the half of the entire photo cells 101a to 101l. That is, although all of the photo cells 101a to 101l on a sensor IC are constantly operating, output image signals can be partially thinned out and outputted in accordance with the control signal when the output image signals are picked up to the external. For that reason, a voltage level of the image signal is always kept constant, and an image processing circuit at a post stage can be structured by the conventional circuit.

Since the conventional image sensor IC is structured as described above, the data of the skipped output signal of the light receiving element may be missing because the data is thinned out when the resolution is made rough.

SUMMARY OF THE INVENTION

Therefore, in order to solve the above-mentioned problem, according to an image sensor of the present invention in which a plurality of linear image sensor ICs are arranged linearly, the sensor includes switch elements which connect output terminals of all of a plurality of light receiving elements that output an output signal in accordance with an amount of received light and which are arbitrarily conductive connective in accordance with 1/n of the highest resolution from the highest resolution, and the output of the average value is held in respective sample/hold circuits at the plural same potential, to thereby read only arbitrary data in accordance with the resolution at the time of reading. In the case where there are unnecessary data, the data is skipped so as to increase a read rate and eliminate missing of data of the output signals of the light receiving elements.

BRIEF DESCRIPTION OF THE DRAWINGS

These and other objects and advantages of this invention will become more fully apparent from the following detailed description taken with the accompanying drawings in which:

FIG. 3 is a timing chart in case of the highest resolution a;

FIG. 12 is a diagram showing a switch setting between light receiving elements in the respective resolutions in FIG. 2; and FIG. 13 is a diagram showing the setting of testing a function of the switch elements between the light receiving elements in FIG. 2.

DETAILED DESCRIPTION OF THE PREFERRED EMBODIMENTS

Hereinafter, a description will be given in more detail of preferred embodiments of the present invention with reference to the accompanying drawings.

Figure 1:
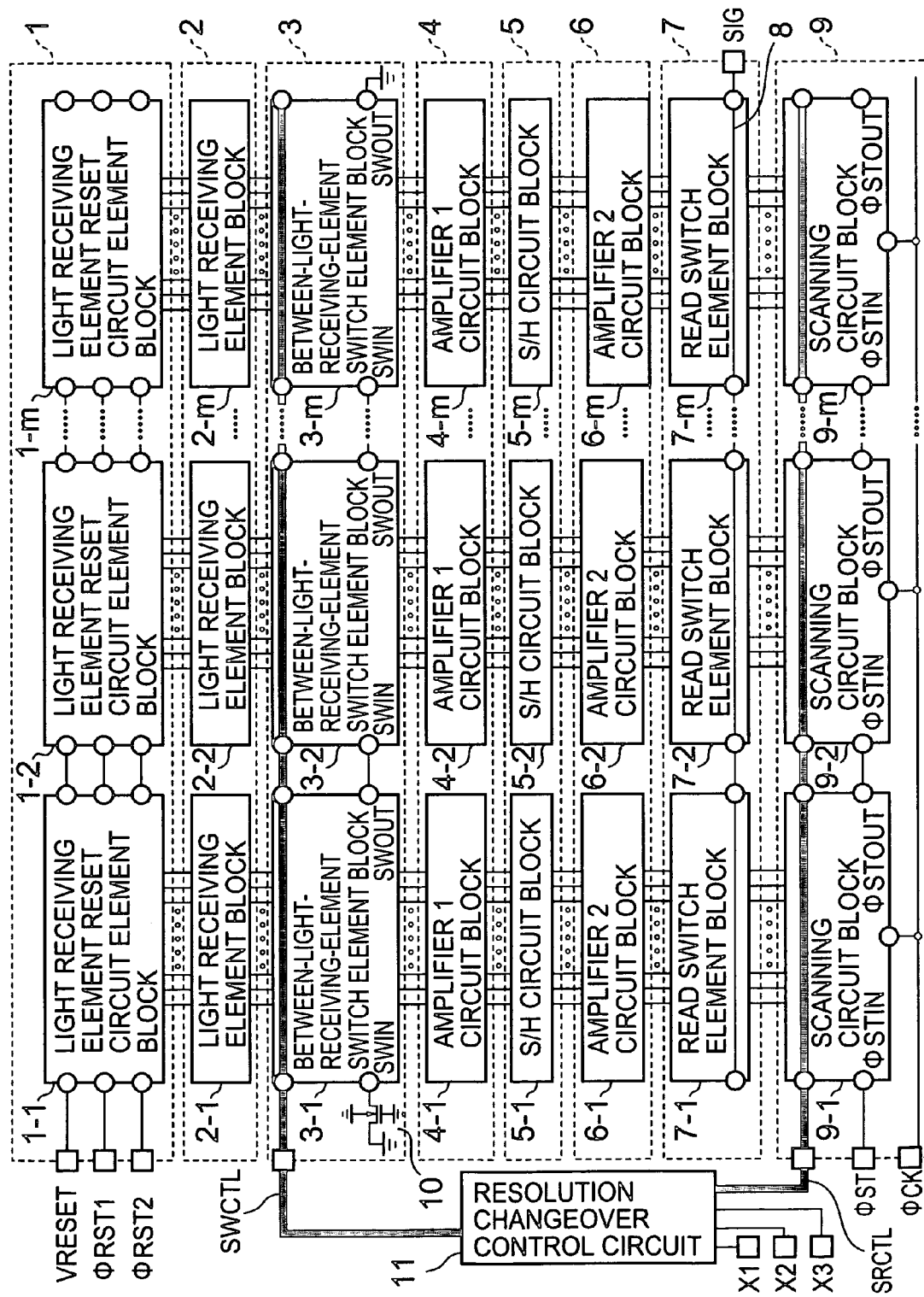
FIG. 1 is a circuit diagram of an entire image sensor in accordance with an embodiment of the present invention.
Figure 2:
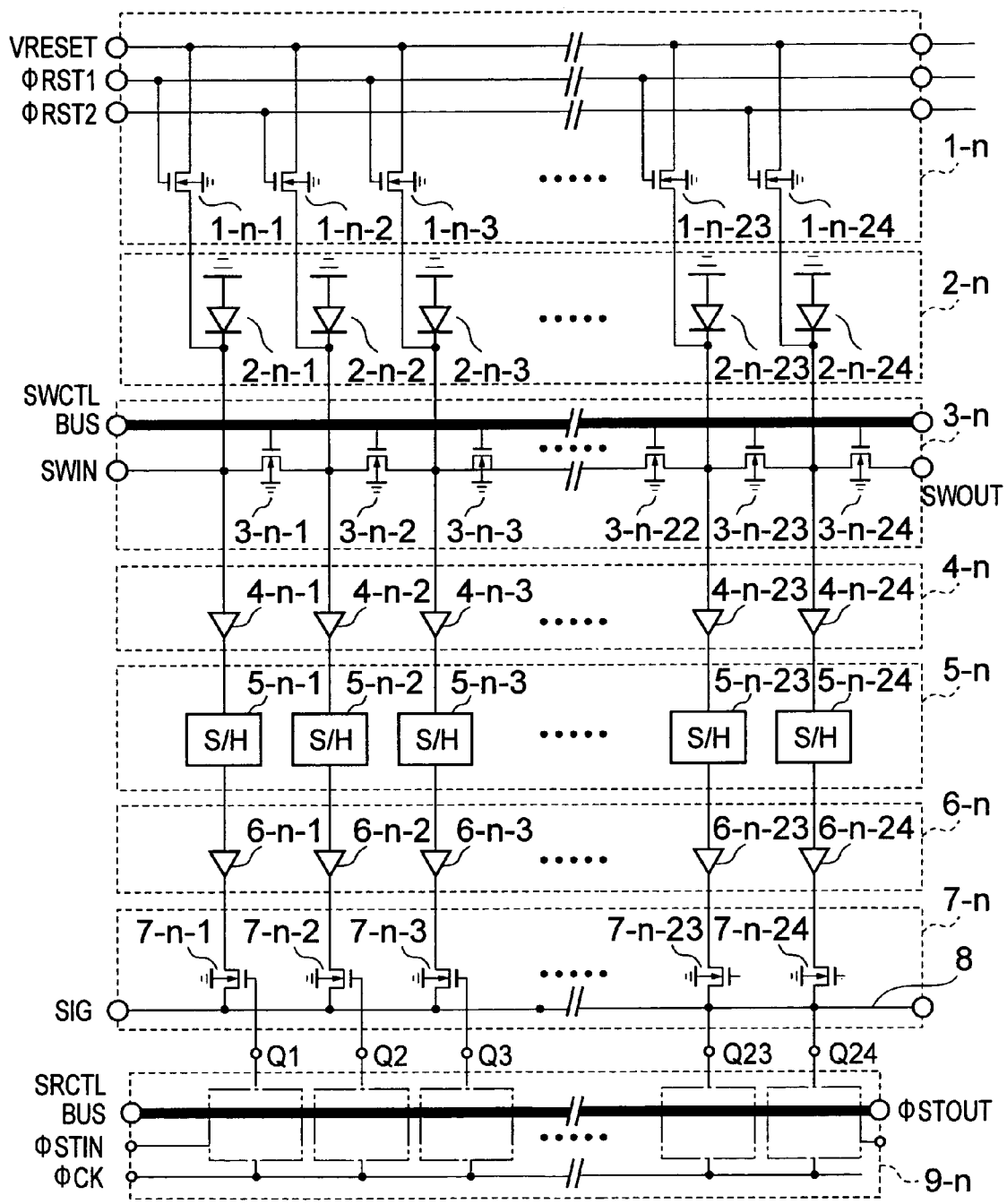
FIG. 2 is a circuit diagram of an n-th block in FIG. 1.

FIG. 1 is a circuit diagram showing an entire image sensor in accordance with an embodiment of the present invention, and FIG. 2 is a circuit diagram showing an n-th block in FIG. 1. FIG. 12 shows the setting of switches 3-n-1, 2, 3, . . . 24 between the light receiving elements in FIG. 2. FIG. 13 is the setting of switches 3-n-1, 2, 3, . . . 24 between the light receiving elements during a test in FIG. 2.

Figure 3:
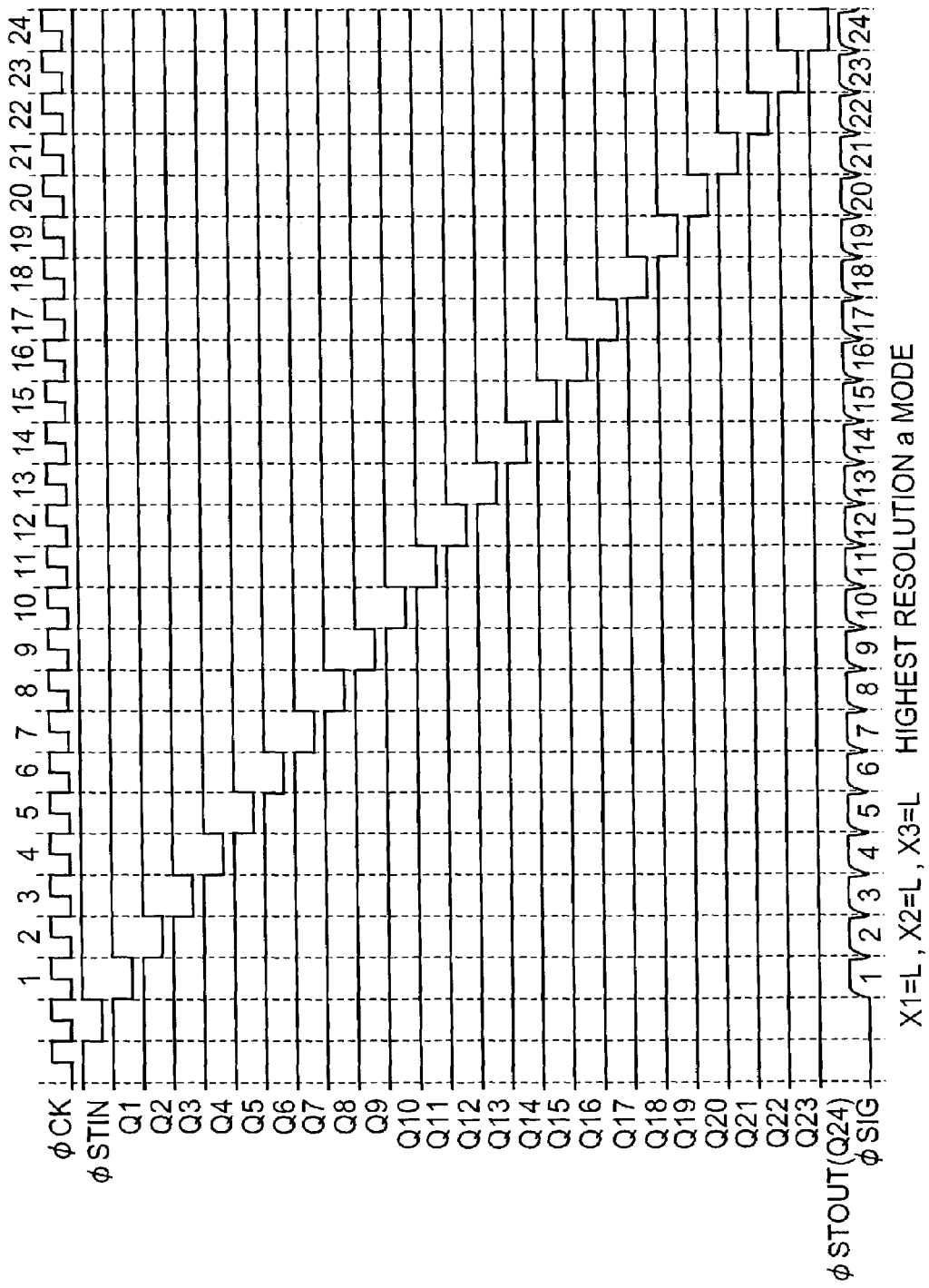
Figure 4:
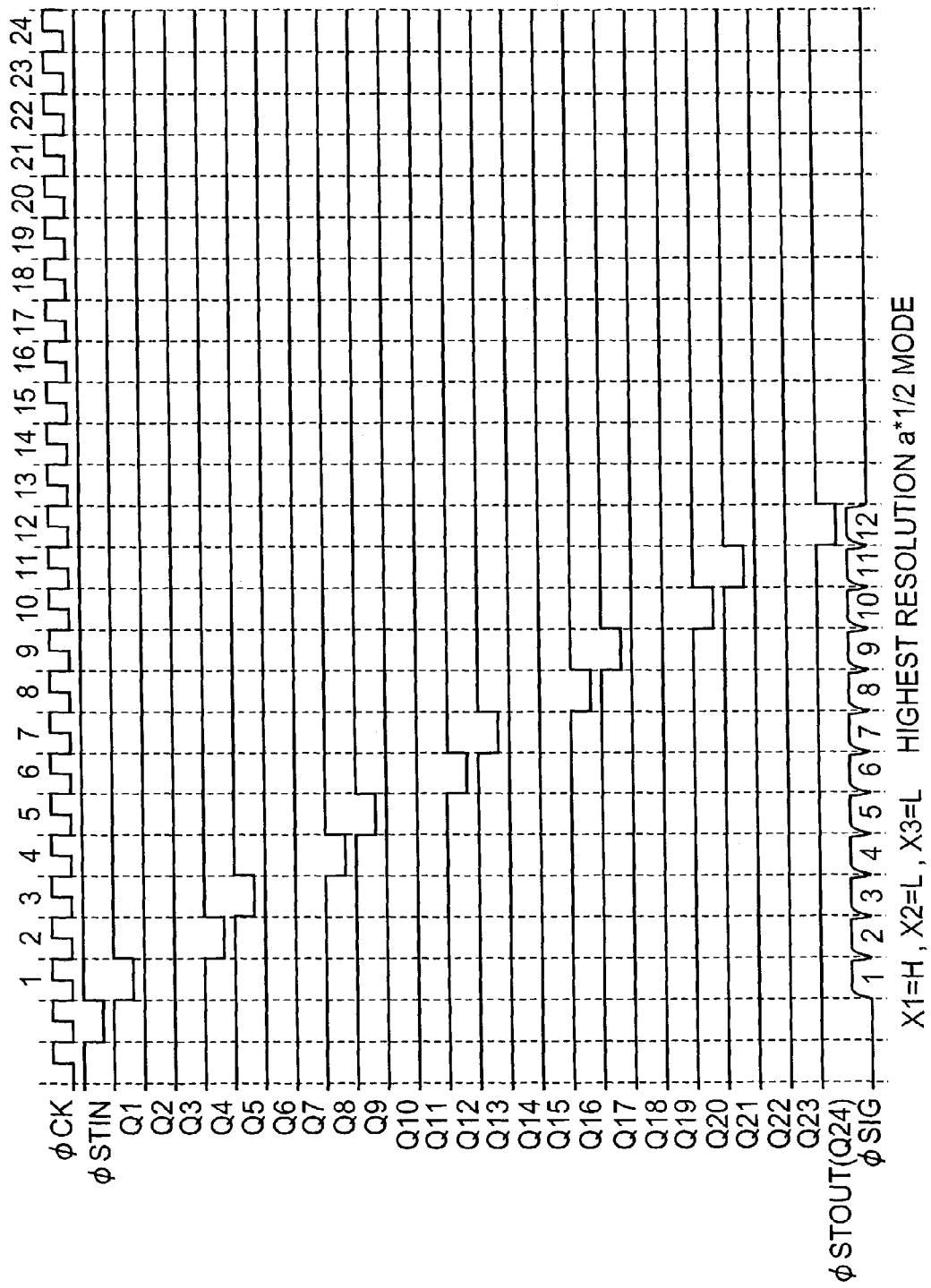
FIG. 4 is a timing chart in case of the highest resolution $a*\frac{1}{2}$.
Figure 5:
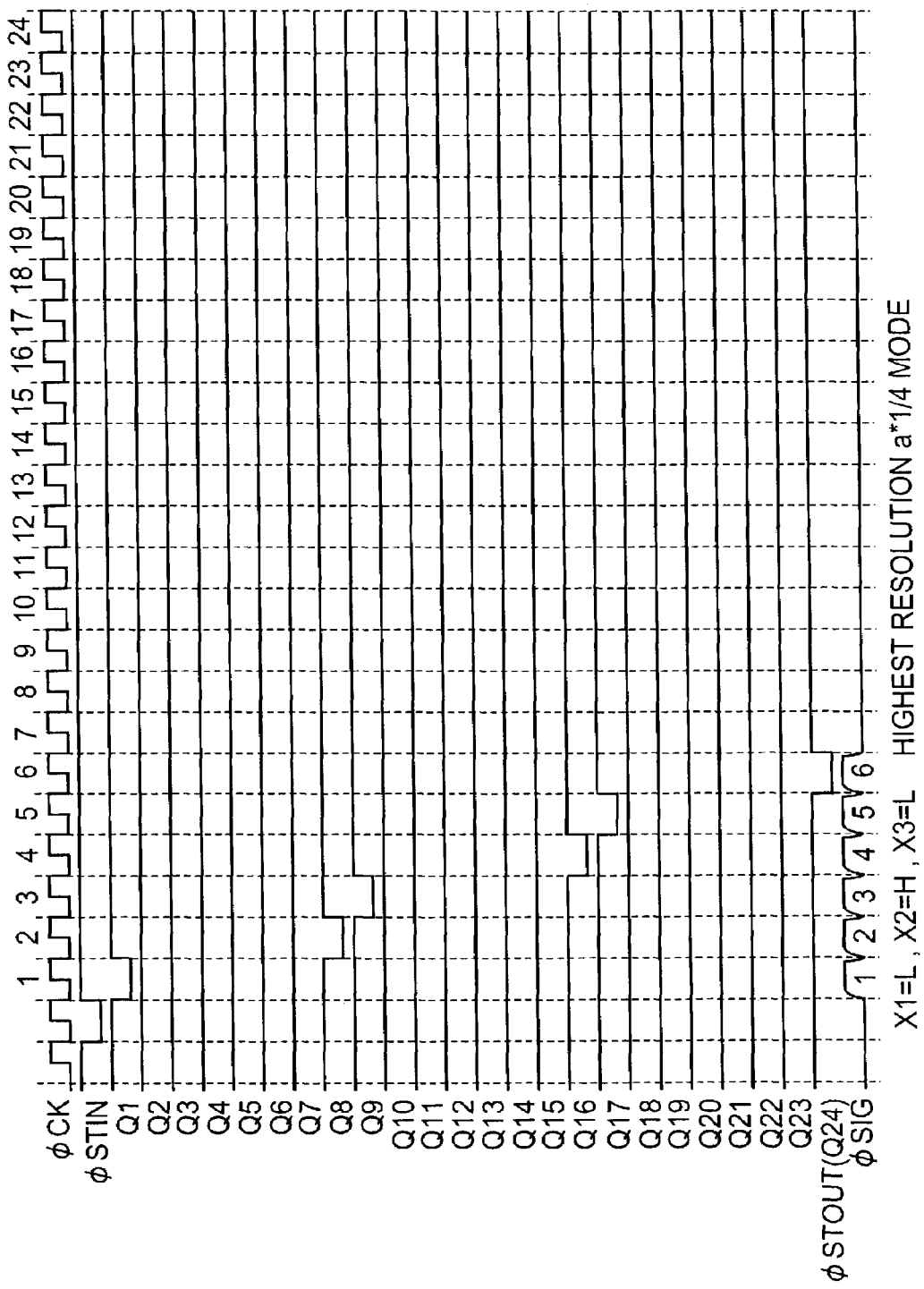
FIG. 5 is a timing chart in case of the highest resolution $a*\frac{1}{4}$.
Figure 6:
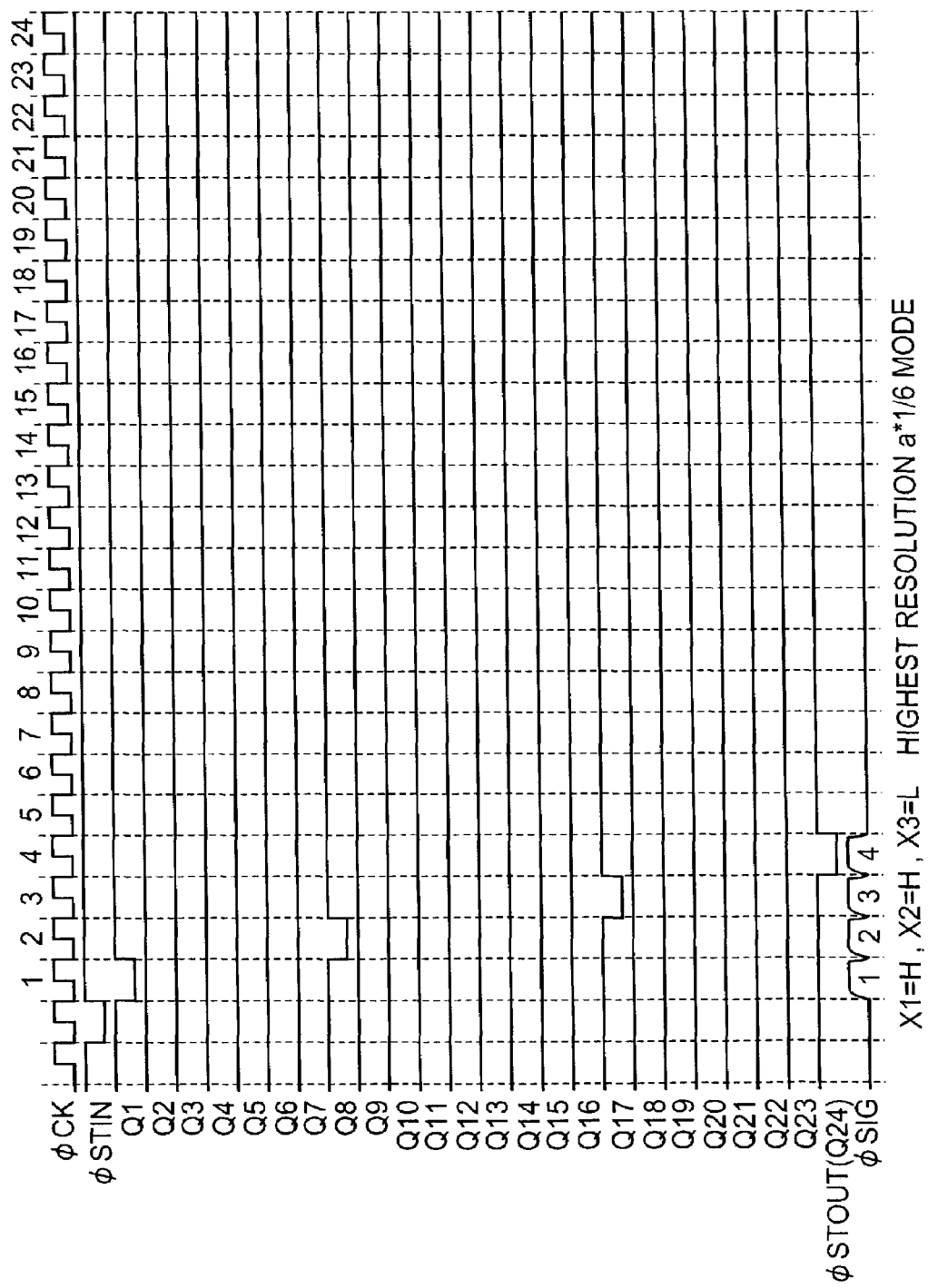
FIG. 6 is a timing chart in case of the highest resolution $a*\frac{1}{6}$.
Figure 7:
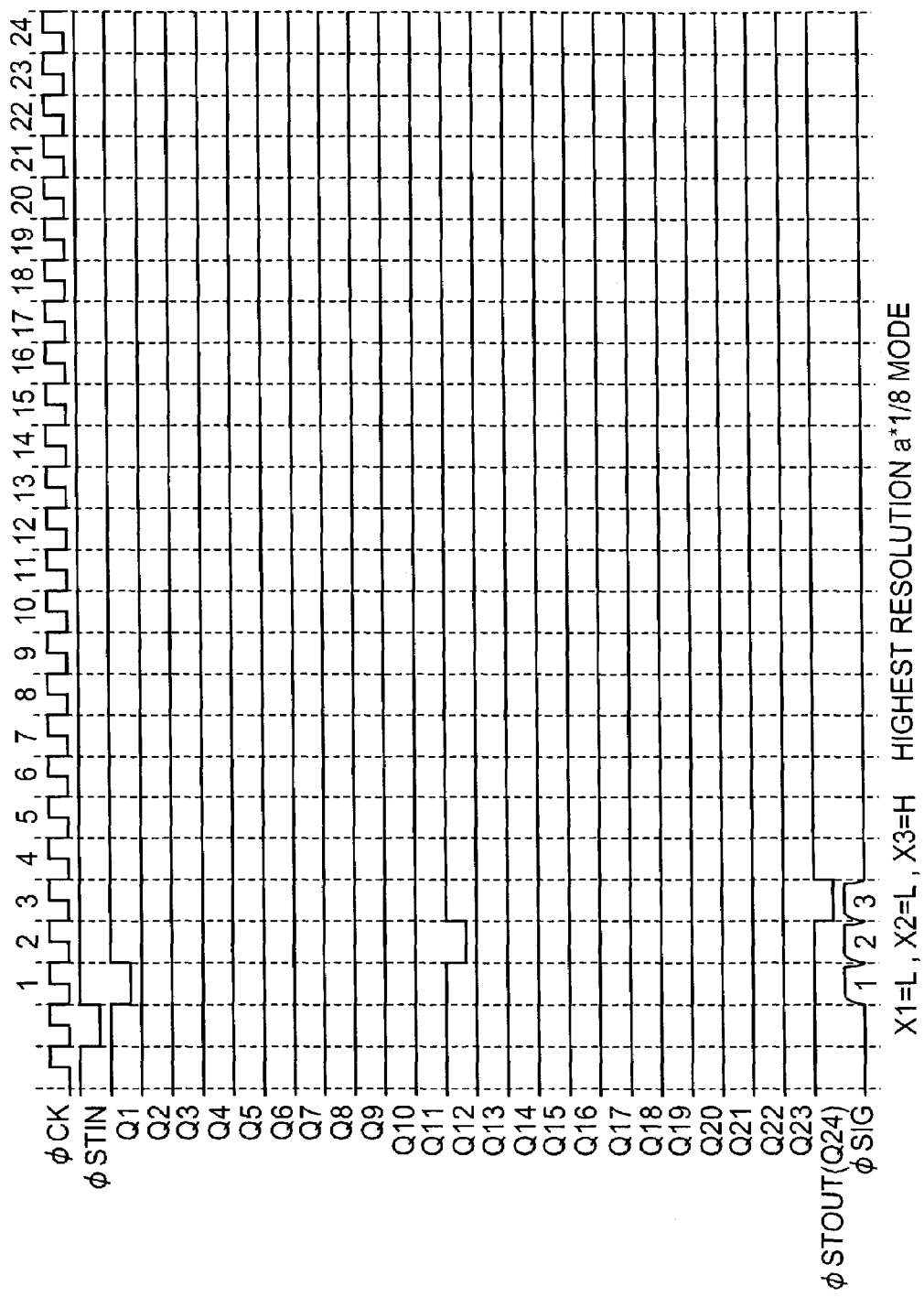
FIG. 7 is a timing chart in case of the highest resolution $a*\frac{1}{8}$.
Figure 8:
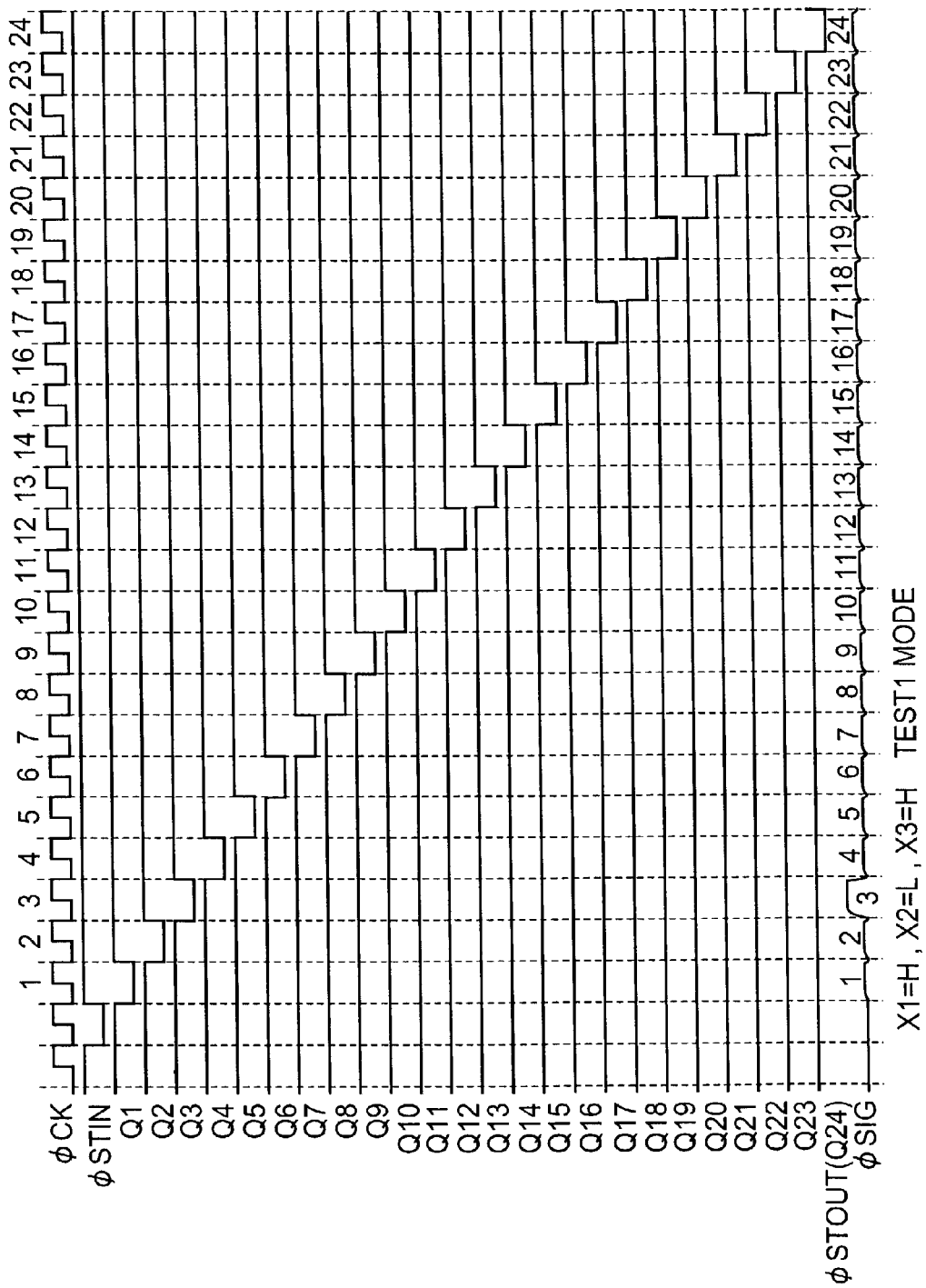
FIG. 8 is a timing chart in case of a TEST1 mode.
Figure 9:
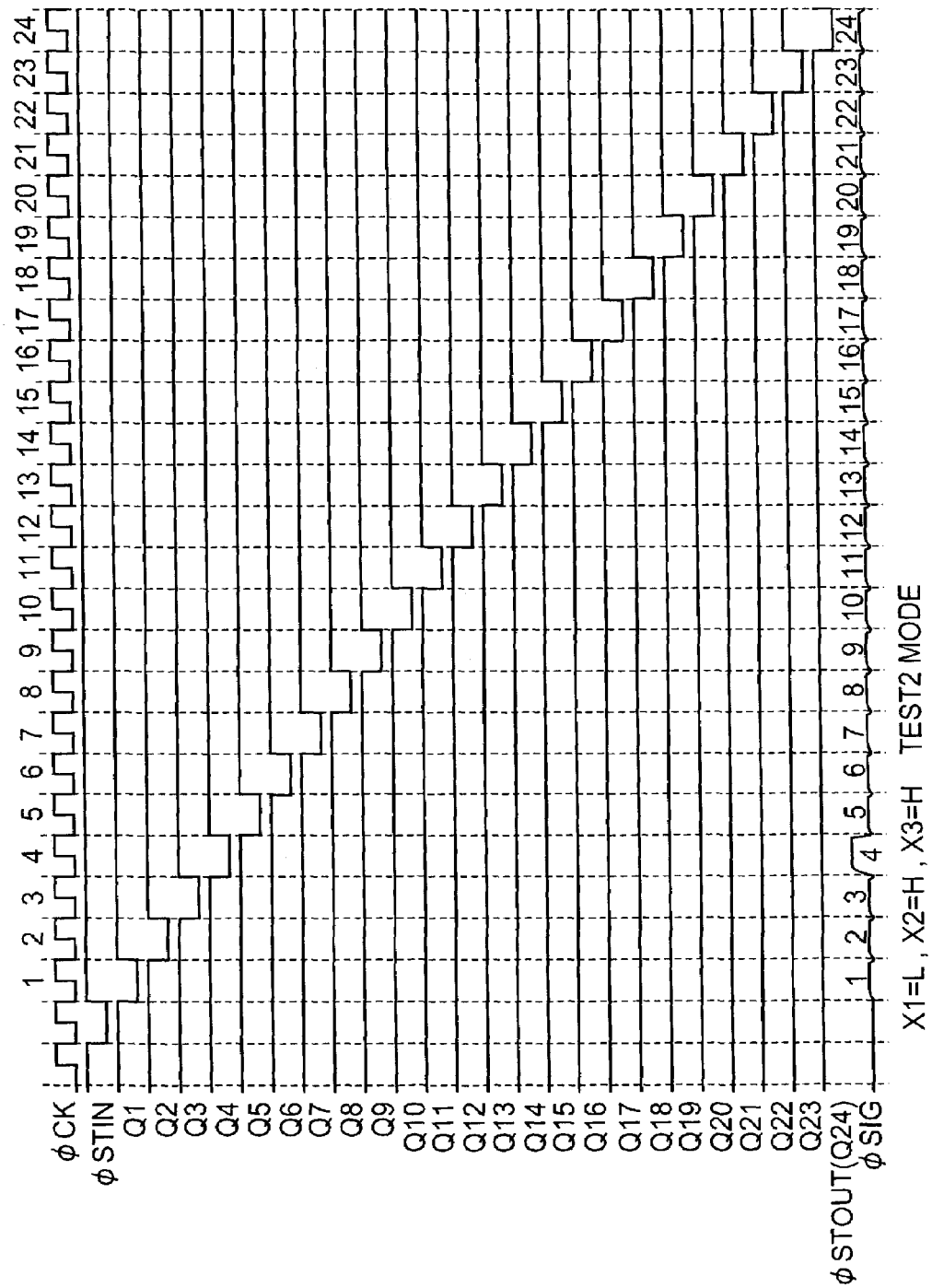
FIG. 9 is a timing chart in case of a TEST2 mode.
Figure 10:
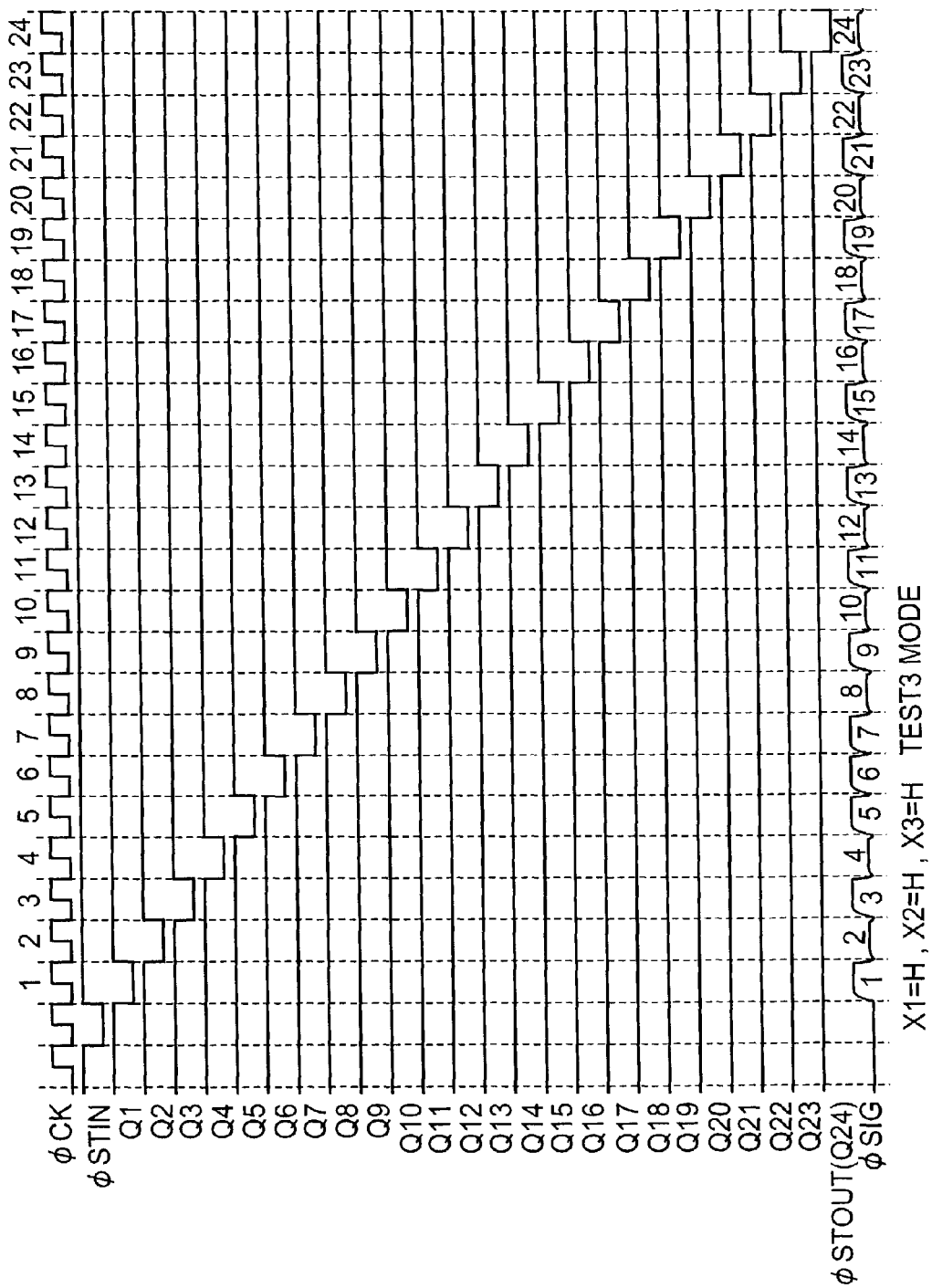
FIG. 10 is a timing chart in case of a TEST3 mode.
Figure 11:
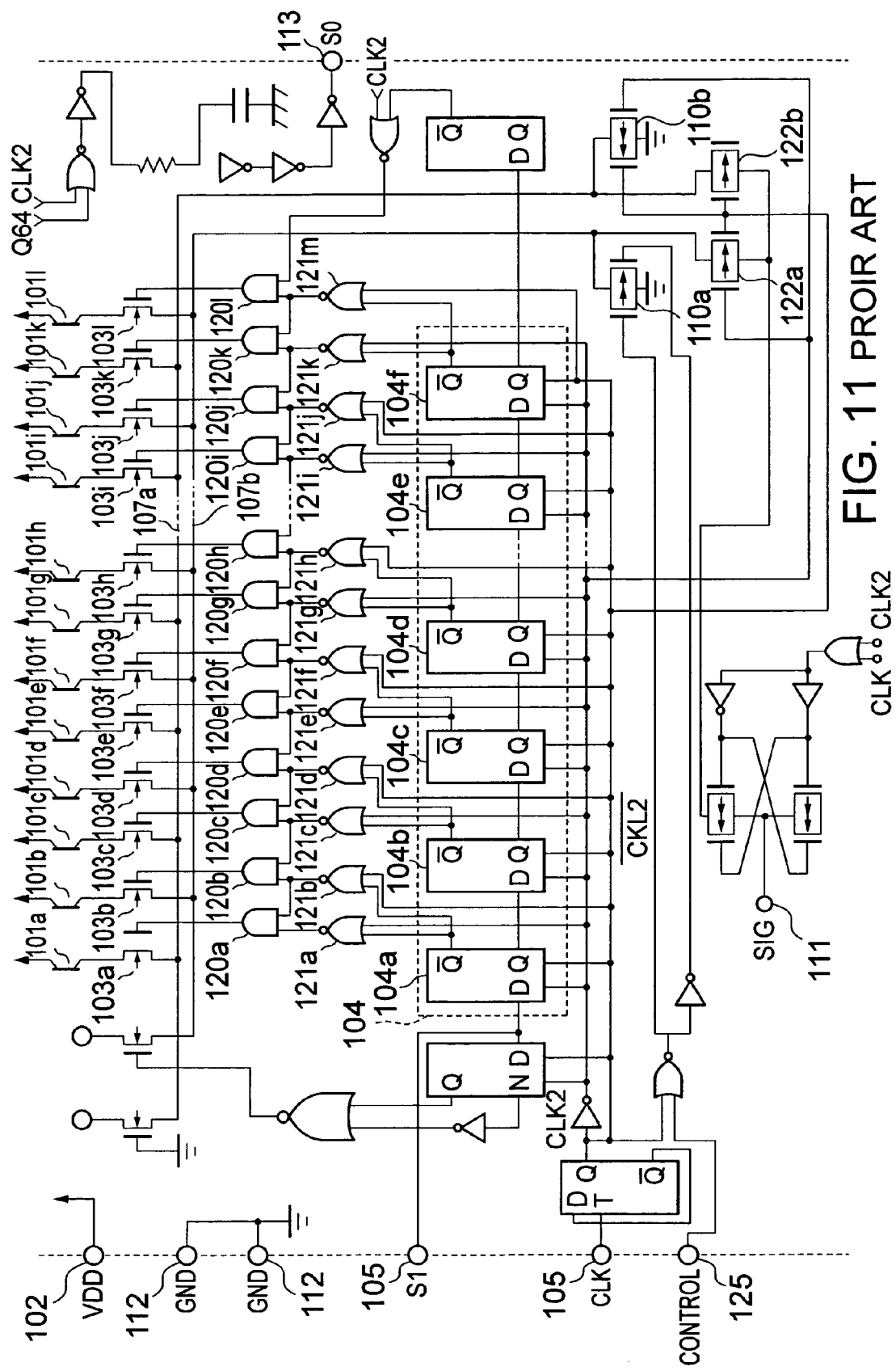
FIG. 11 is a conventional circuit diagram.

FIG. 3 is a timing chart in case of a highest resolution a. FIG. 4 is a timing chart in case of a highest resolution $a*\frac{1}{2}$. FIG. 5 is a timing chart in case of a highest resolution $a*\frac{1}{4}$. FIG. 6 is a timing chart in case of a highest resolution $a*\frac{1}{6}$. FIG. 7 is a timing chart in case of a highest resolution $a*\frac{1}{8}$. FIG. 8 is a timing chart in case of a TEST1 mode. FIG. 9 is a timing chart in case of a TEST2 mode. FIG. 10 is a timing chart in case of a TEST3 mode.

Referring to FIG. 1, there are provided a reset circuit array 1 of light receiving elements along which reset circuit element blocks 1-1, 1-2, . . . , 1-m of the light receiving elements are aligned, a plurality of light receiving element arrays 2 along which light receiving element blocks 2-1, 2-2, . . . , 2-m are aligned, a between-light-receiving-elements switch element array 3 along which between-light-receiving-elements switch element blocks 3-1, 3-2, . . . , 3-m are aligned, a circuit array 4 of an amplifier 1 along which amplifier 1 circuit blocks 4-1, 4-2, . . . , 4-m are aligned, a sample/hold circuit array 5 along which sample/hold circuit blocks 5-1, 5-2, . . . , 5-m are aligned, a circuit array 6 of an amplifier 2 along which circuit blocks 6-1, 6-2, . . . , 6-m of the amplifier 2 are aligned, a read switch element array 7 along which read switch element blocks 7-1, 7-2, . . . , 7-m are aligned, a common signal line 8, and a scanning circuit array 9 along which the scanning circuit blocks 9-1, 9-2, . . . , 9-m are aligned. A GND potential is given to an output terminal and a gate of a dummy switch 10 and the dummy switch 10 is usually in an OFF state, and another output terminal thereof is connected to an input terminal SWIN of the between-light-receiving-elements switch element block 3-1 and connected for making the load capacities of the output terminals of the first light receiving element of the light receiving element block 2-1 identical with the load capacities of the output terminals of the respective other light receiving elements, to thereby obtain a uniform characteristic without any fixed pattern noise at joints of the respective blocks.

Reference numeral 11 denotes a changeover control circuit of the respective resolutions and the TEST modes which is so structured as to arbitrarily generate a control signal SWCTL of the between-light-receiving-elements switch and a control signal SRCTL of the read-skipping order of the scanning circuit in response to input signals X1, X2 and X3.

In the reset circuit array 1 of the light receiving elements, a reset voltage VRESET for initializing the light receiving elements, a reset 1 (ΦRST1) and a reset 2 (ΦRST2) that control the reset elements are commonly connected to each block in the array 1.

The between-light-receiving-elements switching element array 2 is connected with a bus line for a control signal (SWCTL) of the switch element between the light receiving elements.

Each block in the read element array 7 is commonly connected via a common signal line (SIG) for reading signals from the light receiving element.

The scanning circuit array 9 is commonly connected with a clock (ΦCK) for driving the scanning circuit, connected with a start pulse (ΦST) and connected with the bus line for the control signal line (SRCTL) that controls the read order of the scanning circuit.

FIG. 2 is a circuit for 24 bits of an n-th stage which corresponds to each of blocks 1, 2, . . . , m of the respective element blocks and of the circuit array blocks, and in the reset circuit element block 1-n of the light receiving element, the reset voltage VRESET voltage is given to one terminals of the reset switch elements (1-n-1, 1-n-3, 1-n-5, . . . , 1-n-23) of the odd-numbered light receiving elements so that the reset switch elements are controlled in accordance with the ΦRST1. The reset voltage VRESET voltage is given to one terminals of the reset switch elements (1-n-2, 1-n-4, 1-n-6, . . . , 1-n-24) of the even-numbered light receiving elements so that the reset switch elements are controlled in accordance with the ΦRST2. The output terminals of the photodiodes (2-n-1, . . . , 2-n-24) of the light receiving element block 2-n are connected with the reset switch elements (1-n-1, . . . , 1-n-24), respectively.

In the between-light-receiving-elements switch element block 3-n, the between-light-receiving-elements switches (3-n-1, 3-n-2, . . . , 3-n-23) are connected with the output terminals between the adjacent light receiving elements, and the between-light-receiving-elements switches are controlled in accordance with the bus line of the control signal (SWCTL), respectively. An SWIN terminal is a terminal that connects a switch element block between the light receiving elements of the adjacent pre-stages or a dummy switch 10 in FIG. 1. An SWOUT terminal is a terminal that connects a switch element block between the light receiving elements of the post stages or a GND potential in FIG. 1.

An amplifier 1 circuit block 4-n is made up of the respective amplifiers 1(4-n-1, . . . , 4-n-24) and temporarily stores the outputs of the respective light receiving elements (2-n-1, . . . , 2-n-24) in sample/hold circuits (5-n-1, . . . , 5-n-24) of the sample/hold circuit array block 5-n as electric charge.

An amplifier 2 circuit block 6-n has the respective amplifiers 2 (6-n-l, . . . , 6-n-24) connected to the switch elements (7-n-1, . . . , 7-n-24) of the read switch element array 7-m, and the outputs (Q1, . . . , Q24) of the scanning circuit array 9-n which is controlled by the SRCTL bus line sequentially turn on the switch elements (7-n-1, . . . , 7-n-24) of the read switch element array 7-m in synchronism with the clock signal ΦCK upon inputting the start pulse ΦSTIN at the time of the highest resolution, and are arbitrarily skipped in reading and outputted when the resolution is made lower, to thereby read the electric charge that is temporarily stored in the sample/hold circuits (5-n-1, . . . , 5-n-24) to the common signal line 8.

FIG. 12 is a diagram showing a switch setting between light receiving elements in the respective resolutions in FIG. 2. When X1, X2, and X3 are low levels, the highest resolution becomes a, and all the switches between the light receiving elements turn off, and the output of the respective light receiving elements (2-n-1, . . . , 2-n-24) is stored as the electric charge in the respective sample/hold circuits (5-n-1, . . . , 5-n-24). FIG. 3 is a timing chart in the case where the highest resolution is a. Upon inputting the start pulse ΦSTIN, the read switch elements (7-n-1, . . . , 7-n-24) sequentially turn on in the stated order of the outputs Q1, . . . , Q24 of the scanning circuits in synchronism with the clock signal ΦCK, and the electric charges that are stored in the respective sample/hold circuits (5-n-1, . . . , 5-n-24) are read to the common signal line 8 (SIG).

Subsequently, when X1 is a high level, and X2 and X3 are low levels, the highest resolution becomes a*½, and the odd-numbered switches (3-n-1, 3-n-3, . . . , 3-n-23) between the light receiving elements turn on, and the even-numbered switches (3-n-2, 3-n-4, . . . , 3-n-24) between the light receiving elements turn off, whereby the outputs of two adjacent light receiving elements are connected to each other. In this example, the amount of photoelectric charge of the light receiving elements according to the amount of received light is doubled, and the joint capacity is also is doubled, so that they are offset, and the mean value of the output is stored as the electric charge in the two adjacent sample/hold circuits. FIG. 4 is a timing chart in the case where the highest resolution is a*½. Upon inputting the start pulse ΦSTIN, the read switch elements (7-n-1, 7-n-4, 7-n-5, 7-n-8, 7-n-9, 7-n-12, 7-n-13, 7-n-14, 7-n-16, 7-n-19, 7-n-21, 7-n-22, 7-n-24) sequentially turn on in the stated order of the outputs Q1, Q4, Q5, Q8, Q9, Q12, Q13, Q16, Q17, Q21, Q22 and Q24 of the scanning circuit in synchronism with the clock signal ΦCK, and the electric charges that are stored in the respective sample/hold circuits (5-n-1, 5-n-4, 5-n-5, 5-n-8, 5-n-9, 5-n-12, 5-n-13, 5-n-14, 5-n-16, 5-n-19, 5-n-21, 5-n-22, 5-n-24) are read to the common signal line 8 (SIG).

Subsequently, when X1 is a low level, X2 is a high level and X3 is a low level, the highest resolution becomes a*¼, and the switches (3-n-4, 3-n-8, 3-n-12, 3-n-16, 3-n-20,

3-n-24) in the (four-multiple)th stages between the light receiving elements turn off, and the other switches between light receiving elements turn on, whereby the outputs of four adjacent light receiving elements are connected to one another. In this example, the amount of photoelectric charges of the light receiving elements according to the amount of received light increases by four times, and the joint capacity also increases by four times, so that they are offset, and the mean value of the output is stored as electric charge in the four adjacent sample/hold circuits. FIG. 5 is a timing chart in the case where the highest resolution is a*¼. Upon inputting the start pulse ΦSTIN, the read switch elements (7-n-1, 7-n-8, 7-n-9, 7-n-16, 7-n-19, 7-n-24) sequentially turn on in the stated order of the outputs Q1, Q8, Q9, Q16, Q17 and Q24 of the scanning circuits in synchronism with the clock signal ΦCK, and the electric charges that are stored in the respective sample/hold circuits (5-n-1, 5-n-8, 5-n-9, 5-n-16, 5-n-19, 5-n-24) are read to the common signal line 8 (SIG).

Subsequently, when X1 is a low level, X2 is a low level and X3 is a low level, the highest resolution becomes a*⅙, and the switches (3-n-6, 3-n-12, 3-n-18, 3-n-24) in the (six-multiple)th stages between the light receiving elements turn off, and the other switches between light receiving elements turn on, whereby the outputs of six adjacent light receiving elements are connected to one another. In this example, the amount of photoelectric charges of the light receiving elements according to the amount of received light increases by six times, and the joint capacity also increases by six times, so that they are offset, and the mean value of the output is stored as electric charge in the six adjacent sample/hold circuits. FIG. 6 is a timing chart in the case where the highest resolution is a*⅙.

Upon inputting the start pulse ΦSTIN, the read switch elements (7-n-1, 7-n-8, 7-n-17, 7-n-24) sequentially turn on in the stated order of the outputs Q1, Q8, Q17 and Q24 of the scanning circuits in synchronism with the clock signal ΦCK, and the electric charges that are stored in the respective sample/hold circuits (5-n-1, 5-n-8, 5-n-17, 5-n-24) are read to the common signal line 8 (SIG).

Subsequently, when X1 is a low level, X2 is a low level and X3 is a high level, the highest resolution becomes a*⅛, and the switches (3-n-8, 3-n-16, 3-n-24) in the (eight-multiple)th stages between the light receiving elements turn off, and the other switches between light receiving elements turn on, whereby the outputs of eight adjacent light receiving elements are connected to one another. In this example, the amount of photoelectric charges of the light receiving elements according to the amount of received light increases by eight times, and the joint capacity also increases by eight times, so that they are offset, and the mean value of the output is stored as electric charge in the eight adjacent sample/hold circuits.

FIG. 7 is a timing chart in the case where the highest resolution is a*⅛. Upon inputting the start pulse ΦSTIN, the read switch elements (7-n-1, 7-n-12, 7-n-24) sequentially turn on in the stated order of the outputs Q1, Q12 and Q24 of the scanning circuits in synchronism with the clock signal ΦCK, and electric charges that are stored in the respective sample/hold circuits (5-n-1, 5-n-12, 5-n-24) are read to the common signal line 8 (SIG).

The between-light-receiving-element switches 3-n-24 turn off in all of the resolutions, and in FIG. 1, one output terminal SWOUT of the between-light-receiving-element switch element block 3-m is connected to GND and connected for the load capacity of the output terminal of the last light receiving element in the light receiving element block 3-m to be identical with the load capacities of the output terminals of the other respective light receiving elements, to thereby obtain a uniform characteristic with the elimination of the fixed pattern noise at the joint portions of the respective blocks.

FIG. 13 shows the setting at which the function of the switch elements between the light receiving elements in FIG. 2 is tested. When X1 is a high level, X2 is a low level and X3 is a high level, the mode is set to the TEST1 mode, and the even-numbered switches (3-n-2, 3-n-4, . . . , 3-n-24) between the respective light receiving elements turn on, and the odd-numbered switches (3-n-1, 3-n-3, . . . , 3-n-23) between the respective light receiving elements turn off so that outputs of the two adjacent light receiving elements are connected to each other. In this example, ΦRST2 always becomes high level, and the even-numbered light receiving elements (2-n-2, 2-n-4, . . . , 2-n-24) are always given the initialization voltage VRESET.

In the case where light is irradiated onto all of the light receiving elements to conduct a test, if the even-numbered switches between the light receiving elements normally function, all of the light receiving elements output an initialized level in a dark state, and if abnormality exists, the odd-numbered light receiving elements output in response to the amount of received light, thereby being capable of detecting the abnormality. FIG. 8 is a timing chart in the case where the mode is set to the TEST1 mode. As in the highest resolution a, when the start pulse ΦSTIN is inputted, the read switch elements (7-n-1, . . . , 7-n-24) sequentially turn on in accordance with the outputs Q1, . . . , Q24 of the scanning circuits in synchronism with the clock signal ΦCK, to thereby read electric charges stored in the respective sample/hold circuits (5-n-1, . . . , 5-n-24) to the common signal line 8 (SIG). This example shows a case where abnormality exists in the between-light-receiving-element switch 3-n-2, and the output of the third light receiving element becomes high.

Subsequently, when X1 is a high level, X2 is a high level and X3 is a low level, the mode is set to the TEST2 mode, and the even-numbered switches (3-n-2, 3-n-4, . . . , 3-n-24) between the respective light receiving elements turn off, and the odd-numbered switches (3-n-1, 3-n-3, . . . , 3-n-23) between the respective light receiving elements turn on so that outputs of the two adjacent light receiving elements are connected to each other. In this example, ΦRST2 always becomes high level, and the odd-numbered light receiving elements (2-n-1, 2-n-3, . . . , 2-n-23) are always given the initialization voltage VRESET.

In the case where light is irradiated onto all of the light receiving elements to conduct a test, if the odd-numbered switches between the light receiving elements normally function, all of the light receiving elements output an initialized level in a dark state, and if abnormality exists, the even-numbered light receiving elements output in response to the amount of received light, thereby being capable of detecting the abnormality. FIG. 9 is a timing chart in the case where the mode is set to the TEST2 mode. As in the highest resolution a, when the start pulse ΦSTIN is inputted, the read switch elements (7-n-1, . . . , 7-n-24) sequentially turn on in accordance with the outputs Q1, . . . , Q24 of the scanning circuits in synchronism with the clock signal ΦCK, to thereby read electric charges stored in the respective sample/hold circuits (5-n-1, . . . , 5-n-24) to the common signal line 8 (SIG). This example shows a case where abnormality exists in the between-light-receiving-element switch 3-n-2, and the output of the fourth light receiving element becomes high.

Subsequently, when X1 is a high level, X2 is a high level and X3 is a high level, the mode is set to the TEST3 mode, and all the switches (3-n-1, . . . , 3-n-24) between the light receiving elements turn off, whereby ΦRST2 always becomes high level, and the even-numbered light receiving elements (2-n-2, 2-n-4, 2-n-24) are always given the initialization voltage VRESET. In the case where a light is irradiated onto all of the light receiving elements to conduct a test, if the switches between the light receiving elements normally function, the even-numbered light receiving elements output an initialized level in a dark state, and the odd-numbered light receiving elements output in response to the amount of received light. If abnormality exists, the even-numbered light receiving elements output in response to the amount of received light, thereby being capable of detecting the abnormality. FIG. 10 is a timing chart in the case where the mode is set to the TEST3 mode. As in the highest resolution a, when the start pulse ΦSTIN is inputted, the read switch elements (7-n-1, . . . , 7-n-24) sequentially turn on in accordance with the outputs Q1, . . . , Q24 of the scanning circuits in synchronism with the clock signal ΦCK, to thereby read electric charges stored in the respective sample/hold circuits (5-n-1, . . . , 5-n-24) to the common signal line 8 (SIG). This example shows a case where abnormality exists in the between-light-receiving-element switch 3-n-6, and the output of the sixth light receiving element becomes high.

As described above, plural kinds of respective resolutions can be selected by the control terminals X1, X2 and X3, and as shown in FIG. 1, in the respective blocks, the image sensor is structured by the same circuits of m stages. The switches between the light receiving elements are selectively turned on, and only an arbitrary scanning circuit scans the average output of the light receiving elements, and plural resolutions where the reading of data is skipped can be selected by multiple from the highest resolution in which the scanning circuit scans all of the light receiving elements of 24×m bits in the number of light receiving elements and the data is sequentially read till the lowest resolution in which the number of light receiving elements is 24×m×⅛ bits. Also, there is obtained an image sensor that can enhance the scanning rate while the amount of information is suppressed to the minimum, to thereby improve the quality due to the fixed pattern noise countermeasure conducted by the dummy switch and the TEST mode.

In this embodiment, for convenience, the bias voltage of the light receiving element is set to GND (0V) but may be set to VBIAS (intermediate potential) or VDD (supply voltage). The between-light-receiving-elements switch element is structured by an NMOS but may be structured by a PMOS or a CMOS (transmission gate). The reset element for initializing the respective light receiving elements is structured by an NMOS but may be structured by a PMOS.

Also, the above-mentioned structure is made such that the terminals X1, X2 and X3 are controlled so as to obtain eight kinds of scanning systems. However, m kinds of scanning systems may be provided by increasing the number of control terminals.

Also, the location of the output of the scanning circuit at the time of low resolution may be changed to be anywhere in conformity to the sample/hold circuit in which the average output of the light receiving elements is held, and the order of the scanning circuit that skips reading in accordance with the resolution may be selected optionally.

Further, in the above description, the image sensor IC uses the photodiode as the sensor element, but if the sensor element is formed of a photo transistor of the photoelectric conversion element, the sensor element is applicable to a linear image sensor IC or an optical fingerprint sensor which can pick up an arbitrary signal or change over the resolution, or an electrostatic fingerprint sensor which can pick up an arbitrary signal or change over the resolution if an electrostatic capacity is used for the sensor element.

As was described above, according to the present invention, a plurality of resolutions can be changed over by the same IC, and missing of data is eliminated by connecting the respective output terminals of the light receiving elements at the time of low resolution, and the output level of the light receiving element due to the resolution becomes always constant because the average value is outputted, with the results that when the input voltage of the post-stage image processing circuit is read, a read rate according to the resolution is obtained in accordance with the scanning circuit that skips reading in accordance with the resolution. Also, when the dummy switches between the respective light receiving elements are connected between the respective blocks and to the first and last light receiving elements, the fixed pattern noise hardly occurs if the load capacities of the respective light receiving elements are made to be identical with each other. Further, the quality can be enhanced by detecting the malfunction due to the process abnormality of the switches between the light receiving elements by the TEST mode.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A linear image sensor having a plurality of linear image sensor ICs mounted linearly thereon, each of the linear image sensor ICs comprising:

a light receiving element circuit array having a plurality of light receiving elements for outputting output signals in accordance with an amount of light received, the light receiving elements being arranged according to a preselected resolution level;

a reset circuit element array for initializing the light receiving element circuit array;

an array of switch elements interconnecting output terminals of adjacent two or more of the light receiving elements for switching between the preselected resolution level of the light receiving elements and at least one other resolution level constituting a fraction of the preselected resolution level;

a first amplifier circuit array connected to output terminals of the light receiving elements;

a sample and hold circuit array for temporarily holding an output of the first amplifier circuit array;

a second amplifier circuit array connected to output terminals of the sample and hold circuit array;

a reading switch element array for reading an output of the second amplifier circuit array;

a scanning circuit array for controlling the reading switch element array; and a dummy switch element connected to an output terminal of a first one of the light receiving elements.

2. A linear image sensor according to claim 1; wherein the array of switch elements interconnects the output terminals of all the light receiving elements, each of the switch elements interconnecting an output terminal of an i-th light receiving element and an output terminal of an adjacent (i+1)-th light receiving element, where i represents any one of integers from 1 to n and n represents the number of light receiving elements.

3. A linear image sensor according to claim 1; wherein the linear image sensor ICs output the average of outputs of an arbitrary number of adjacent light receiving elements whose output terminals are interconnected by the switch elements when the switch elements are turned on.

4. A linear image sensor according to claim 1; wherein the scanning circuit array of each of the linear image sensor ICs functions to arbitrarily skip reading output signals of the sample and hold circuit array.

5. A linear image sensor according to claim 1; wherein the reset circuit element array of each of the linear image sensor ICs has a plurality of reset elements; and wherein each of the linear image sensor ICs has a plurality of control lines for controlling the reset elements to initialize the light receiving element circuit array.

6. A linear image sensor according to claim 1; wherein each of the linear image sensor ICs has a test circuit for testing whether the switch elements are open or closed.

7. A linear image sensor comprising:
a plurality of light receiving elements each arranged in accordance with a preselected resolution level for outputting an output signal in accordance with an amount of light received by the light receiving elements;
a plurality of switch elements interconnecting output terminals of at least two adjacent light receiving elements;
a switching control circuit for controlling the switch elements to switch the preselected resolution level to a resolution level 1/n of the preselected resolution level, where n is an integer greater than 1;
a plurality of first amplifier circuits connected to respective output terminals of the light receiving elements;
a plurality of sample and hold circuits for temporarily holding output signals from the respective first amplifier circuits;
a plurality of second amplifier circuits connected to respective output terminals of the sample and hold circuits;
a plurality of reading switch devices for reading output signals from the respective second amplifier circuits;
a plurality of scanning circuits for controlling operation of the respective reading switch devices; and
a dummy switch element connected to an output terminal of a first one of the light receiving elements.

8. A linear image sensor according to claim 7; further comprising a test circuit for testing whether the switch elements are open or closed.

9. A linear image sensor according to claim 7; wherein the scanning circuits function to arbitrarily skip reading output signals of the sample and hold circuits.

10. A linear image sensor according to claim 7; further comprising a plurality of reset circuit elements for initializing the respective light receiving elements; and a plurality of control lines for controlling operation of the respective reset circuit elements.

11. A linear image sensor according to claim 7; wherein the switch elements interconnect output terminals of all of the light receiving elements.

12. A linear image sensor according to claim 7; wherein each of the switch elements interconnects an output terminal of an i-th light receiving element and an output terminal of an adjacent (i+1)-th light receiving elements, where i represents any one of integers from 1 to n and n represents the number of light receiving elements.

13. A linear image sensor IC having a plurality of light receiving units, each of the light receiving units comprising:
a light receiving element for outputting an output signal in accordance with an amount of light received, the light receiving element being arranged according to a preselected resolution level;
a reset circuit element for initializing the light receiving element;
a switch element interconnecting an output terminal of the light receiving element to an output terminal of a light receiving element of an adjacent light receiving unit for switching between the preselected resolution level of the light receiving element and at least one other resolution level constituting a fraction of the preselected resolution level;
a first amplifier circuit connected to an output terminal of the light receiving element;
a sample and hold circuit for temporarily holding an output of the first amplifier circuit;
a second amplifier circuit connected to an output terminal of the sample and hold circuit;
a reading switch element for reading an output of the second amplifier circuit;
a scanning circuit for controlling the reading switch element; and
a dummy switch element connected to an output terminal of a first one of the light receiving elements.

14. A linear image sensor IC according to claim 13; wherein the scanning circuit functions to arbitrarily skip reading output signals of the sample & hold circuit.

15. A linear image sensor IC according to claim 13; further comprising a test circuit for testing whether the switch element is open or closed.

16. A linear image sensor having a plurality of linear image sensors IC according to claim 13.

* * * * *